(12) United States Patent
Hung et al.

(10) Patent No.: US 9,673,100 B2
(45) Date of Patent: Jun. 6, 2017

(54) SEMICONDUCTOR DEVICE HAVING CONTACT PLUG IN TWO DIELECTRIC LAYERS AND TWO ETCH STOP LAYERS

(71) Applicant: UNITED MICROELECTRONICS CORP., Hsin-Chu (TW)

(72) Inventors: Ching-Wen Hung, Tainan (TW); Chih-Sen Huang, Tainan (TW); Yi-Wei Chen, Taichung (TW); Chien-Ting Lin, Hsinchu (TW); Shih-Fang Tzou, Tainan (TW); Chia-Lin Lu, Taoyuan County (TW); Chun-Lung Chen, Tainan (TW); Kun-Yuan Liao, Hsin-Chu (TW); Feng-Yi Chang, Tainan (TW); Chieh-Te Chen, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/536,696

(22) Filed: Nov. 10, 2014

(65) Prior Publication Data
US 2016/0104645 A1   Apr. 14, 2016

(30) Foreign Application Priority Data
Oct. 14, 2014 (CN) .......................... 2014 1 0541924

(51) Int. Cl.
*H01L 21/8234* (2006.01)
*H01L 21/311* (2006.01)
(Continued)

(52) U.S. Cl.
CPC ............. *H01L 21/823437* (2013.01); *H01L 21/31144* (2013.01); *H01L 21/76816* (2013.01); *H01L 21/76895* (2013.01); *H01L 21/76897* (2013.01); *H01L 21/823431* (2013.01); *H01L 21/823475* (2013.01); *H01L 27/088* (2013.01);
(Continued)

(58) Field of Classification Search
None
See application file for complete search history.

(56) References Cited

U.S. PATENT DOCUMENTS

| 8,358,012 B2 | 1/2013 | Haran et al. |
| 2012/0104471 A1* | 5/2012 | Chang ............... H01L 21/76838 257/288 |

(Continued)

OTHER PUBLICATIONS

Hung, Title of Invention: Method of Forming Semiconductor Structure Having Contact Plug, U.S. Appl. No. 13/740,289, filed Jan. 14, 2013.

*Primary Examiner* — Bilkis Jahan
(74) *Attorney, Agent, or Firm* — Winston Hsu (57) ABSTRACT

A method for fabricating semiconductor device is disclosed. The method includes the steps of: providing a substrate; forming a plurality of gate structures on the substrate; forming a first stop layer on the gate structures; forming a second stop layer on the first stop layer; forming a first dielectric layer on the second stop layer; forming a plurality of first openings in the first dielectric layer to expose the second stop layer; forming a plurality of second openings in the first dielectric layer and the second stop layer to expose the first stop layer; and removing part of the second stop layer and part of the first stop layer to expose the gate structures.

6 Claims, 6 Drawing Sheets

(51) Int. Cl.
  *H01L 29/06* (2006.01)
  *H01L 27/088* (2006.01)
  *H01L 29/49* (2006.01)
  *H01L 21/768* (2006.01)

(52) U.S. Cl.
  CPC ...... *H01L 27/0886* (2013.01); *H01L 29/0653* (2013.01); *H01L 29/495* (2013.01); *H01L 29/4966* (2013.01)

(56) References Cited

U.S. PATENT DOCUMENTS

| | | |
|---|---|---|
| 2012/0139061 A1 | 6/2012 | Ramachandran et al. |
| 2013/0292794 A1* | 11/2013 | Pai ................ H01L 23/5223 257/532 |
| 2014/0151763 A1 | 6/2014 | Hung et al. |
| 2014/0239363 A1* | 8/2014 | Pan ................ H01L 27/0629 257/306 |

* cited by examiner

SEMICONDUCTOR DEVICE HAVING CONTACT PLUG IN TWO DIELECTRIC LAYERS AND TWO ETCH STOP LAYERS

BACKGROUND OF THE INVENTION

1. Field of the Invention

The invention relates to a method for fabricating semiconductor device, and more particularly, to a method of using four photo-etching processes for forming openings in dielectric layers.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

However, integration of metal gate and contact plugs still faces some issues in conventional FinFET fabrication due to optical constraint. For instance, issues such as direct penetration of contact plugs through metal gates often arise and affect the performance of the device. Hence, how to improve the current FinFET fabrication and structure has become an important task in this field.

SUMMARY OF THE INVENTION

According to a preferred embodiment of the present invention, a method for fabricating semiconductor device is disclosed. The method includes the steps of: providing a substrate; forming a plurality of gate structures on the substrate; forming a first stop layer on the gate structures; forming a second stop layer on the first stop layer; forming a first dielectric layer on the second stop layer; forming a plurality of first openings in the first dielectric layer to expose the second stop layer; forming a plurality of second openings in the first dielectric layer and the second stop layer to expose the first stop layer; and removing part of the second stop layer and part of the first stop layer to expose the gate structures.

According to another aspect of the present invention, a semiconductor device is disclosed. The semiconductor device includes: a substrate; a plurality of gate structures on the substrate; an interlay dielectric (ILD) layer around the gate structures; a first stop layer on the ILD layer and the gate structures; a first dielectric layer on the first stop layer; a second stop layer on the first dielectric layer; a second dielectric layer on the second stop layer; a plurality of first contact plugs in the ILD layer, the first stop layer, and the first dielectric layer for electrically connecting to a source/drain region in the substrate; a plurality of second contact plugs in the second stop layer and the second dielectric layer for electrically connecting to the first contact plugs; and a plurality of third contact plugs in the first stop layer, the first dielectric layer, the second stop layer, and the second dielectric layer for electrically connecting to the gate structures.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
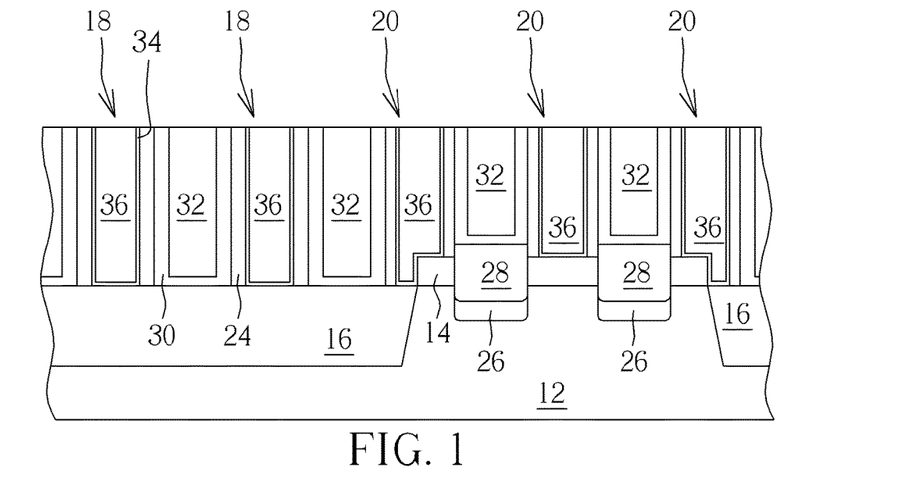
FIGS. 1-4 illustrate a method for fabricating semiconductor device according to a first embodiment of the present invention.

Referring to FIGS. 1-4, FIGS. 1-4 illustrate a method for fabricating semiconductor device according to a first embodiment of the present invention. Despite this embodiment pertains to a non-planar transistor fabrication process, the embodiment could be applied to both planar and non-planar transistor fabrication process. As shown in FIG. 1, a substrate 12, such as a silicon substrate or silicon-on-insulator (SOI) substrate is provided, and a transistor region, such as a PMOS region or a NMOS region is defined on the substrate 12. At least a first fin-shaped structure 14 and an insulating layer 16 are formed on the substrate 12, in which the bottom of the fin-shapes structure 14 is preferably enclosed by the insulating layer 16, such as silicon oxide to form a shallow trench isolation (STI). A plurality of metal gates 18, 20 are formed on part of the fin-shaped structure 14.

The formation of the fin-shaped structure 14 could be accomplished by first forming a patterned mask (now shown) on the substrate, 12, and an etching process is performed to transfer the pattern of the patterned mask to the substrate 12. Next, depending on the structural difference of a tri-gate transistor or dual-gate fin-shaped transistor being fabricated, the patterned mask could be stripped selectively or retained, and deposition, chemical mechanical polishing (CMP), and etching back processes are carried out to form an insulating layer 16 surrounding the bottom of the fin-shaped structure 14. Alternatively, the formation of the fin-shaped structure 14 could also be accomplished by first forming a patterned hard mask (not shown) on the substrate 12, and then performing an epitaxial process on the exposed substrate 12 through the patterned hard mask to grow a semiconductor layer. This semiconductor layer could then be used as the corresponding fin-shaped structure 14. In another fashion, the patterned hard mask could be removed selectively or retained, and deposition, CMP, and then etching back could be used to form an insulating layer 16 to surround the bottom of the fin-shaped structure 14. Moreover, if the substrate 12 were a SOI substrate, a patterned mask could be used to etch a semiconductor layer on the substrate until reaching a bottom oxide layer underneath the semiconductor layer to form the corresponding fin-shaped structure. If this means is chosen the aforementioned steps for fabricating the insulating layer 16 could be eliminated.

The fabrication of the metal gates 18, 20 could be accomplished by a gate first process, a high-k first approach from gate last process, or a high-k last approach from gate last process. Since this embodiment pertains to a high-k first approach, dummy gates (not shown) composed of high-k dielectric layer and polysilicon material could be first formed on the fin-shaped structure 14 and the insulating layer, and a spacer 24 is formed on the sidewall of the dummy gates. A source/drain region 26 and epitaxial layer 28 are then formed in the fin-shaped structure 14 and/or substrate 12 adjacent to two sides of the spacer 24, a contact etch stop layer (CESL) 30 is formed on the dummy gates, and an interlayer dielectric (ILD) layer 32 composed of tetraethyl orthosilicate (TEOS) is formed on the CESL 30.

Next, a replacement metal gate (RMG) process could be conducted to planarize part of the ILD layer 32 and CESL 30 and then transforming the dummy gates into metal gates 18 and 20. The RMG process could be accomplished by first performing a selective dry etching or wet etching process, such as using etchants including ammonium hydroxide ($NH_4OH$) or tetramethylammonium hydroxide (TMAH) to remove the polysilicon layer from dummy gates for forming a recess (not shown) in the ILD layer 32. Next, a conductive layer including at least a U-shaped work function metal layer 34 and a low resistance metal layer 36 is formed in the recess, and a planarizing process is conducted so that the surfaces of the U-shaped work function layer 34 and low resistance metal layer 36 are even with the surface of the ILD layer 32.

In this embodiment, the work function metal layer 34 is formed for tuning the work function of the later formed metal gates to be appropriate in an NMOS or a PMOS. For an NMOS transistor, the work function metal layer 34 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 34 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 34 and the low resistance metal layer 36, in which the material of the barrier layer may include titanium (Ti), titanium nitride (TiN), tantalum (Ta) or tantalum nitride (TaN). Furthermore, the material of the low-resistance metal layer 36 may include copper (Cu), aluminum (Al), titanium aluminum (TiAl), cobalt tungsten phosphide (CoWP) or any combination thereof. Since the process of using RMG process to transform dummy gate into metal gate is well known to those skilled in the art, the details of which are not explained herein for the sake of brevity.

Figure 2:
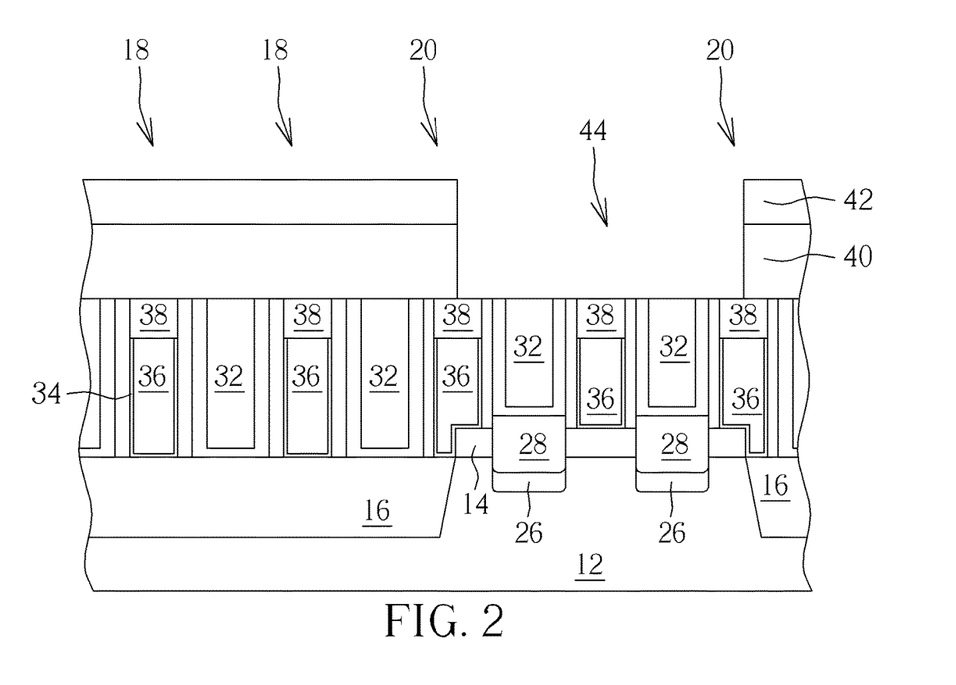

Next, as shown in FIG. 2, part of the metal gates 18 and 20 is removed to form a plurality of recesses, a stop layer 38 is deposited in the recesses, and the stop layer 38 is planarized thereafter. The stop layer 38 could be a single-layered material layer or a composite material layer containing silicon nitride and silicon oxide, and the top surface of the stop layer 38 is preferably even with the top surface of the ILD layer 32.

Next, a dielectric layer 40 is formed on the stop layer 38, a patterned hard mask 42 is formed on the dielectric layer 40, and part of the dielectric layer is removed by using the patterned hard mask 42 as mask to form an opening 44 exposing the ILD layer 32 and metal gates 20. In this embodiment, the patterned hard mask 42 is preferably composed of TiN, but not limed thereto.

Figure 3:
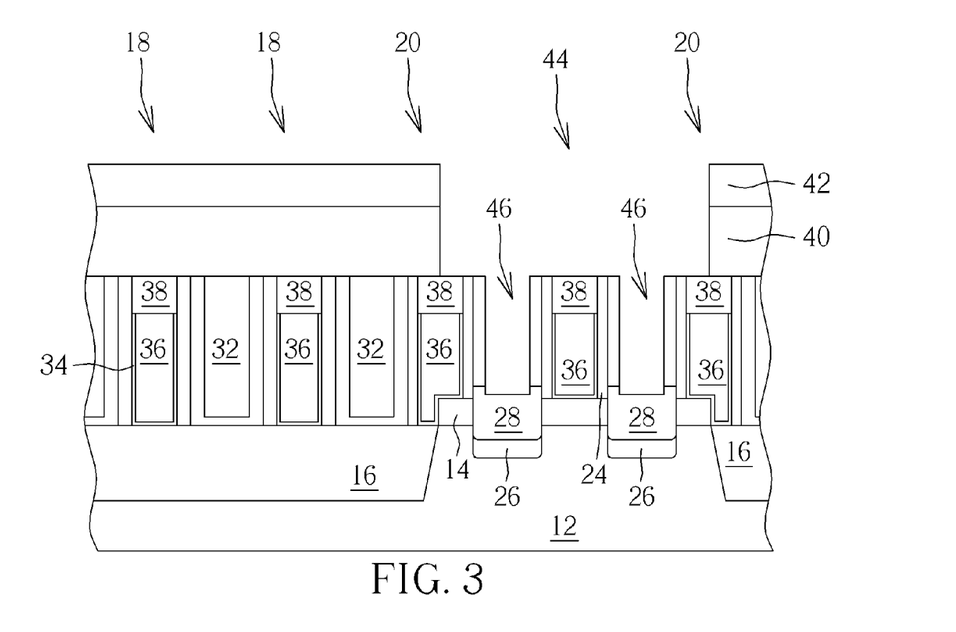

Next, as shown in FIG. 3, the patterned hard mask 42 could be removed selectively, or the patterned hard mask 42 could be used directly as mask to remove part of the ILD layer 32 for forming a plurality of contact holes 46.

Figure 4:
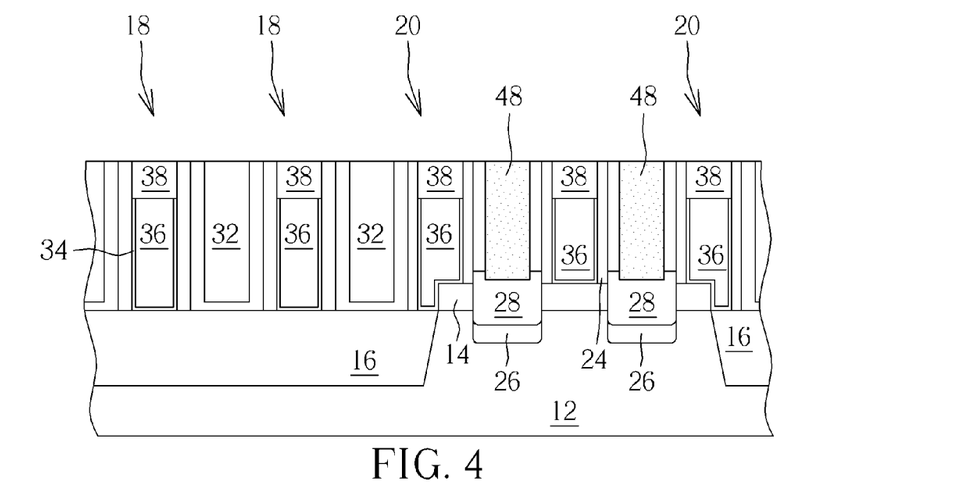

Next, as shown in FIG. 4, a plurality of contact plugs 48 are formed in the contact holes 46. The formation of the contact plugs could be accomplished by sequentially depositing a barrier/adhesive layer (not shown), a seed layer (not shown), and a conductive layer (not shown) into and filling the opening 44 and contact holes 46, in which the barrier/adhesive layer is conformally deposited into the contact holes 46 while the conductive layer is filled the contact holes 46 entirely. The barrier/adhesive layer may be consisted of tantalum (Ta), titanium (Ti), titanium nitride (TiN) or tantalum nitride (TaN), tungsten nitride (WN) or a suitable combination of metal layers such as Ti/TiN, but is not limited thereto. A material of the seed layer is preferably the same as a material of the conductive layer, and a material of the conductive layer may include a variety of low-resistance metal materials, such as aluminum (Al), titanium (Ti), tantalum (Ta), tungsten (W), niobium (Nb), molybdenum (Mo), copper (Cu) or the likes, preferably tungsten or copper, and most preferably tungsten. Next, a planarizing process such as CMP process and/or etching process is conducted to remove part of the barrier/adhesive layer, seed layer, conductive layer, patterned hard mask 42 and dielectric layer 40 so that the top surface of the remaining conductive layer is even with the top surface of the ILD layer 32 and metal gates 18 and 20 to form contact plugs 48.

Figure 5:
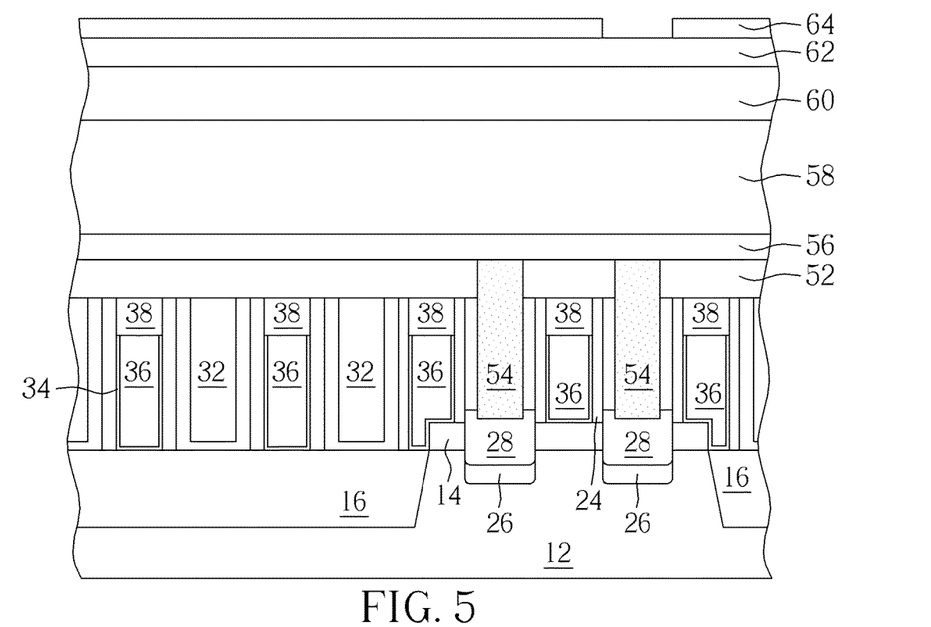
FIGS. 5-8 illustrate a method for fabricating semiconductor device according to another embodiment of the present invention.

Referring to FIGS. 5-8, FIGS. 5-8 illustrate a method for fabricating semiconductor device according to another embodiment of the present invention. In contrast to the embodiments disclosed in FIGS. 1-4 of using one single photo-etching process to form contact plugs 48, it would also be desirable to use two photo-etching processes to fabricate contact plugs according to another embodiment of the present invention. For instance, as shown in FIG. 5, a dielectric layer 52 could be first formed on the stop layer 38 and ILD layer 32, and two photo-etching processes accompanying metal layer deposition and planarizing process could be conducted to form a plurality of contact plugs 54 in the ILD layer 32 and dielectric layer 52 for electrically connecting the source/drain region 26. It should be noted that despite a two photo-etching approach is used in this embodiment for forming contact plugs, the aforementioned single photo-etching approach could also be employed to form contact plugs for later processes, which is also within the scope of the present invention.

Next, a stop layer 56, a dielectric layer 58, an organic dielectric layer (ODL) 60, a silicon-containing hard mask bottom anti-reflective coating (SHB) 62, and a patterned resist 64 are sequentially formed on the dielectric layer 52 and contact plugs 54.

Figure 6:
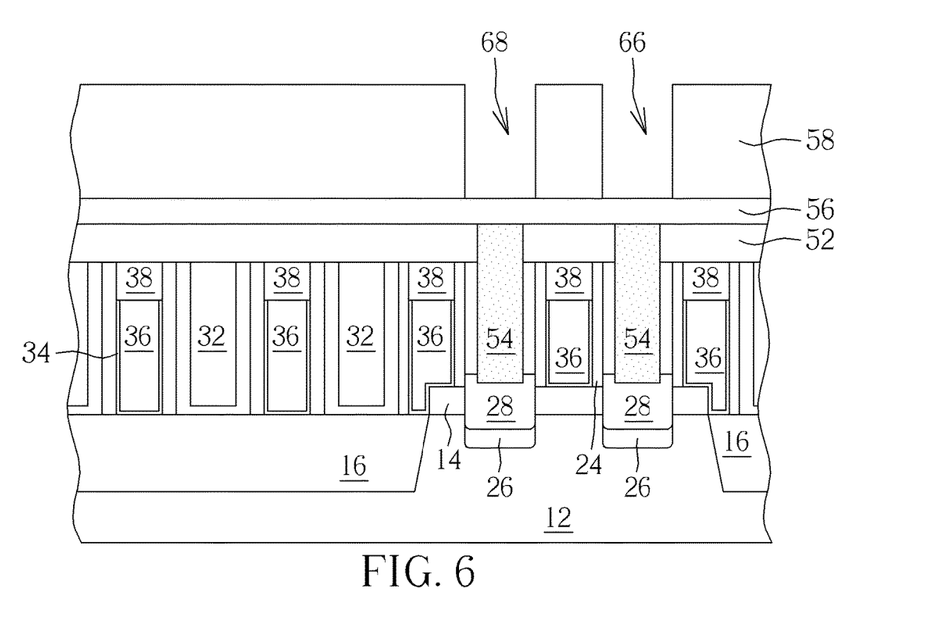

Next, as shown in FIG. 6, two photo-etching processes are conducted to form two openings corresponding to the contact plugs 54 in the dielectric layer 58. For instance, an etching process is conducted by using the patterned resist 62 as mask to remove part of the SHB 62, part of the ODL 60, and part of the dielectric layer 58 for forming an opening 66 exposing the stop layer 56. After removing the patterned resist 64, SHB 62, and ODL 60, another ODL (not shown) is formed on the dielectric layer 58 to fill the opening 66, and another SHB (not shown) and another patterned resist (not shown) are formed sequentially on the ODL. An etching process is then conducted by using the patterned resist as mask to remove part of the SHB, part of the ODL, and part of the dielectric layer for forming another opening 68 adjacent to the opening 66, and the patterned resist, SHB, and ODL are removed thereafter.

Figure 7:
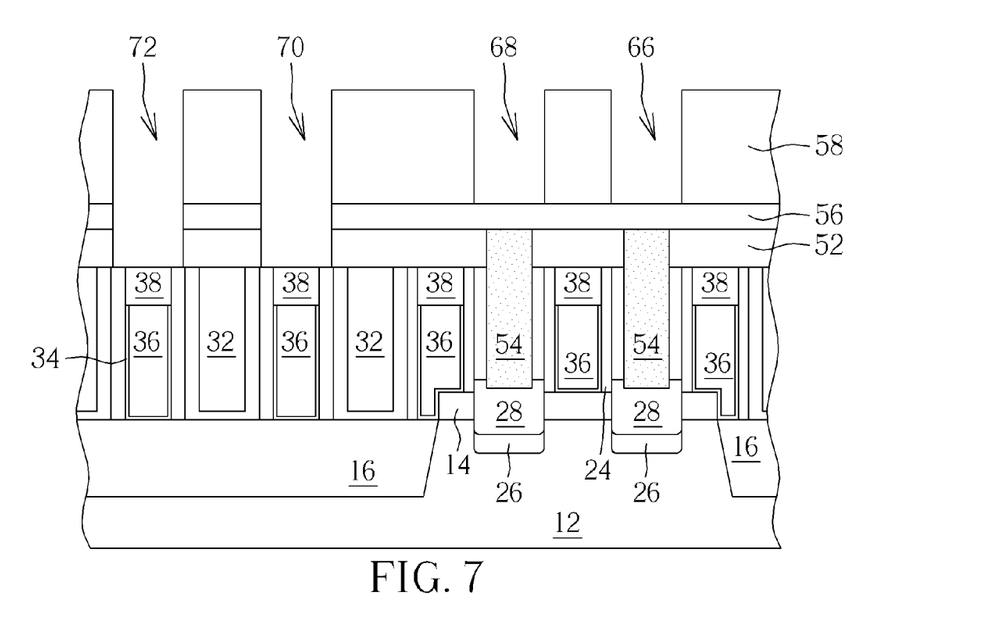

Next, as shown in FIG. 7, another two photo-etching processes are conducted to form two openings 70 and 72 in the dielectric layer 58, stop layer 56, and dielectric layer 52. Similar to the aforementioned approach for forming openings 66 and 68, a ODL (not shown) could be formed on the dielectric layer 58 to fill the openings 66 and 68, and a SHB (not shown) and a patterned resist (not shown) are formed sequentially on the ODL. An etching process is then conducted by using the patterned resist as mask to remove part of the SHB, part of the ODL, part of the dielectric layer 58, part of the stop layer 56, and part of the dielectric layer 52 for forming an opening 70 exposing the stop layer 38. After stripping the patterned resist, SHB, and ODL, another ODL (not shown) is formed on the dielectric layer 58 to fill the openings 66, 68, and 70, and another SHB (not shown) and another patterned resist (not shown) are formed sequentially on the ODL. Another etching is then conducted by using the patterned resist as mask to remove part of the SHB, part of the ODL, part of the dielectric layer 58, part of the stop layer 56, and part of the dielectric layer 52 for forming another opening 72 adjacent to the opening 70, and the patterned resist, SHB, and ODL are removed thereafter.

It should be noted that during the formation of the openings 66, 68, 70, and 72, the etching process preferably stops on the stop layer 56 and stop layer 38 so that the bottom of the openings 66, 68, 70, 72 preferably expose the stop layer 56 and stop layer 38 respectively.

Figure 8:
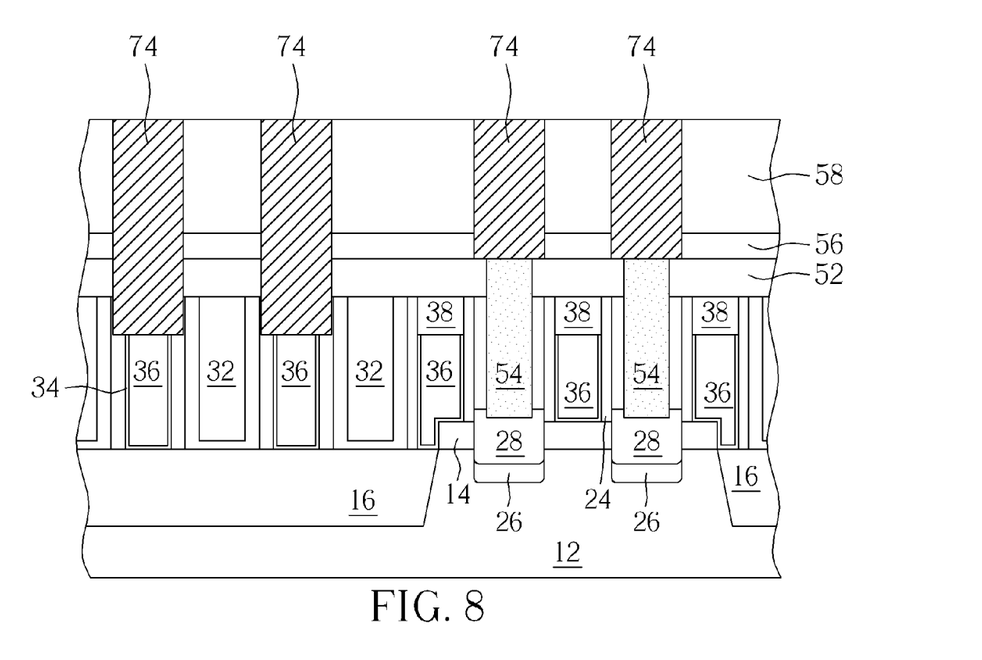

Next, as shown in FIG. 8, part of the stop layer 38 above the STI 16 and part of the stop layer 56 on the fin-shaped structure 14 are removed simultaneously to expose the metal gate 18 on the STI 16 and contact plugs 54 on the fin-shaped structure 14. Contact plug formation could then be conducted according to the aforementioned approach for forming contact plugs 48 in FIG. 4 to deposit conductive material along with planarizing process to form a plurality of contact plugs 74 electrically connected to the contact plugs 54 and metal gates 18 simultaneously.

Figure 9:
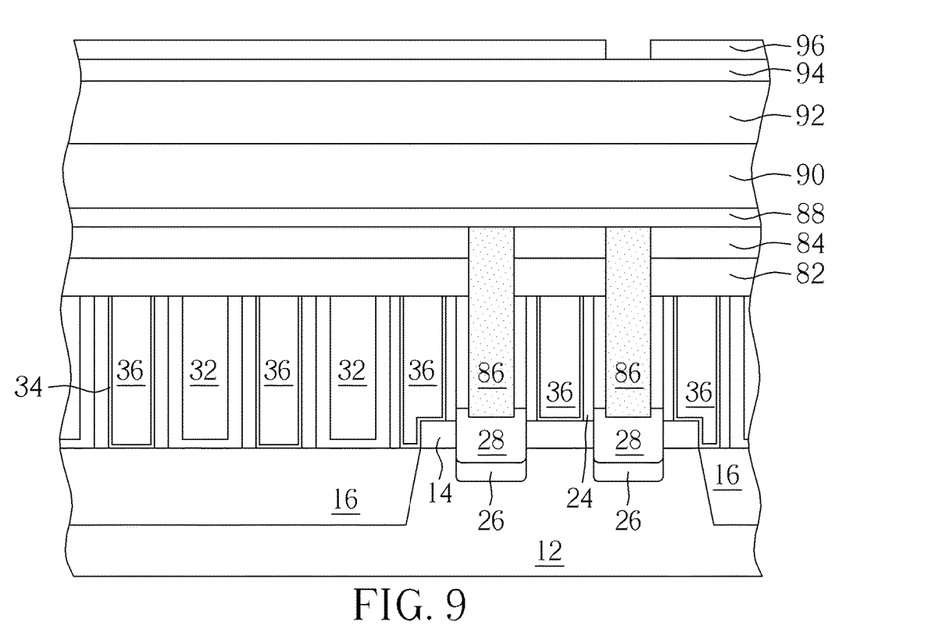
FIGS. 9-12 illustrate a method for fabricating semiconductor device according to another embodiment of the present invention.

Referring to FIGS. 9-12, FIGS. 9-12 illustrate a method for fabricating semiconductor device extending the fabrication process from FIG. 1 according to another embodiment of the present invention. As shown in FIG. 9, a stop layer 82 is formed on the metal gates 18, 20 and ILD layer 32, and a dielectric layer 84 is formed on the stop layer 82. Two pattern transfer and two etching processes are then conducted along with deposition of conductive material and planarizing process to form a plurality of contact plugs 86 in the ILD layer 32, stop layer 82, and dielectric layer 84 for electrically connecting to the source/drain region 26 in the substrate 12 simultaneously. Another stop layer 88 is then covered on the dielectric layer 84 and contact plugs 86, a dielectric layer 90 is formed on the stop layer 88, and a ODL 92, a SHB 94, and a patterned resist 96 are formed sequentially on the dielectric layer 90.

Figure 10:
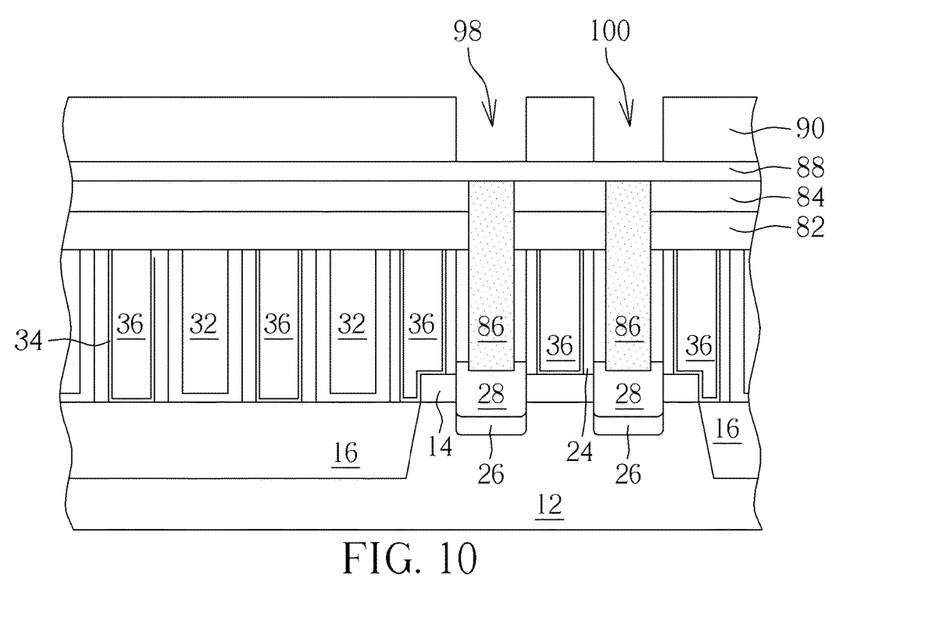

Next, as shown in FIG. 10, two photo-etching processes are conducted to form two openings 98 and 100 in the dielectric layer 90. Similar to the aforementioned approach for forming openings 66 and 68 in FIG. 6, an etching process is conducted by using the patterned resist 96 as mask to remove part of the SHB 94, part of the ODL 92, and part of the dielectric layer 90 for forming an opening 98 exposing the stop layer 88. After stripping the patterned resist 96, SHB 94, and ODL 92, another ODL (not shown) is formed on the dielectric layer 90 to fill the opening 98, and another SHB (not shown) and another patterned resist (not shown) are formed on the ODL. The patterned resist is then used as mask to remove part of the SHB, part of the ODL, and part of the dielectric layer 90 for forming another opening 100 adjacent to the opening 98, and the patterned resist, SHB, and ODL are removed thereafter.

Figure 11:
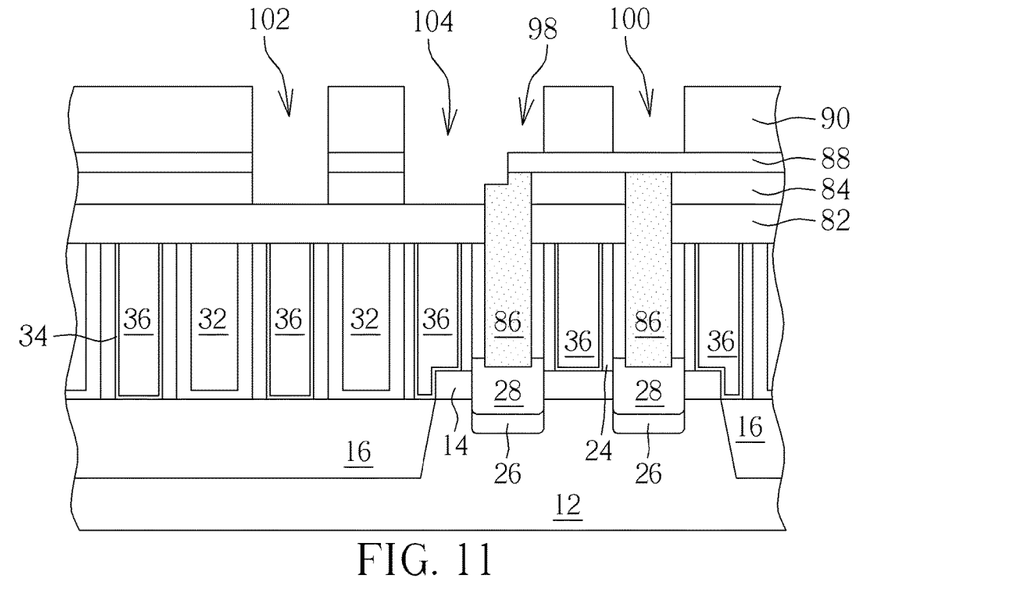

Next, as shown in FIG. 11, two more photo-etching processes are conducted to form two openings 102 and 104 in the stop layer 90, stop layer 88, and dielectric layer 84. Similar to the aforementioned approach for forming openings 70 and 72 in FIG. 7, a ODL (not shown) could be formed on the dielectric layer 90 to fill the openings 98 and 100, and a SHB (not shown) and a patterned resist (not shown) are formed sequentially on the ODL. An etching process is then conducted by using the patterned resist as mask to remove part of the SHB, part of the ODL, part of the dielectric layer 90, part of the stop layer 88, and part of the dielectric layer 84 for forming an opening 102 exposing the stop layer 82. After stripping the patterned resist, SHB, and ODL, another ODL (not shown) is formed on the dielectric layer 90 to fill the openings 98, 100, 102, and another SHB (not shown) and another patterned resist (not shown) are formed on the ODL. The patterned resist is then used as mask to remove part of the SHB, part of the ODL, part of the dielectric layer 90, part of the stop layer 88, and part of the dielectric layer 84 for forming another opening 104 adjacent to the opening 102. It should be noted that the exposure positions of the opening 98 formed by the first photo-etching and the opening 104 formed by the fourth photo-etching could be adjusted according to the demand of the process, such that the two openings 98 and 104 could be formed apart from each other as shown in FIG. 8, or be formed adjacent to each other to reveal an even more greater opening altogether, as shown in FIG. 11. This design could be used to electrically connect gates and source/drain regions of different MOS transistors and could further be applied in process for fabricating SRAM devices, which is also within the scope of the present invention.

Similarly, during the formation of the openings 98, 100, 102, and 104, the etching process preferably stops on the stop layer 88 and stop layer 82 so that the bottom of the openings 98, 100, 102, 104 preferably exposes the stop layer 88 and stop layer 82 respectively.

Figure 12:
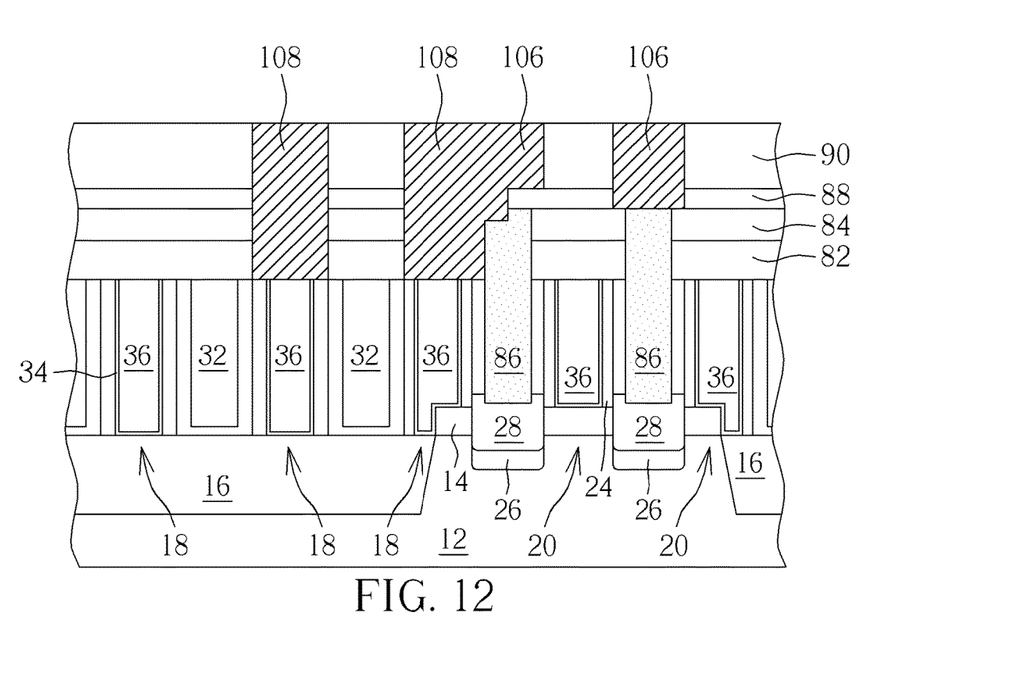

Lastly, as shown in FIG. 12, part of the stop layer 82 above the metal gates 18 and part of the stop layer 88 on the contact plugs 86 are removed simultaneously to expose the metal gates 18 and contact plugs 86. Contact plug formation could then be conducted according to the aforementioned approach for forming contact plugs 48 in FIG. 4 to deposit conductive material along with planarizing process for forming a plurality of contact plugs 106 and 108 electrically connected to the contact plugs 86 and metal gates 18 simultaneously.

Referring to FIG. 12 again, which illustrates a structural view of a semiconductor device according to an embodiment of the present invention. As shown in FIG. 12, the semiconductor device includes a substrate 12, a plurality of metal gates 18 and 20 on the substrate 12, an ILD layer 32 around the metal gates 18 and 20, a stop layer 82 on the ILD layer 32 and the metal gates 18 and 20, a dielectric layer 84 on the stop layer 82, a stop layer 88 on the dielectric layer 84, a dielectric layer 90 on the stop layer 88, a plurality of contact plugs 86 in the ILD layer 32, stop layer 82, and dielectric layer 84 for electrically connecting to a source/drain region 26 in the substrate, a plurality of contact plugs 106 in the stop layer 88 and dielectric layer 90 for electrically connecting to the contact plugs 86, and a plurality of contact plugs 108 in the stop layer 82, dielectric layer 84, stop layer 88, and dielectric layer 90 for electrically connecting to the metal gates 18.

Overall, the present invention preferably discloses a four photo-etching approach for forming openings in dielectric layer, in which the first and second photo-etching processes form two openings on the contact plugs while exposing a stop layer, and the third and fourth photo-etching processes form two openings on the metal gates while exposing another stop layer. Another etching is then conducted thereafter to remove part of the stop layer atop the metal gates and contact plugs simultaneously for exposing the contact plugs and metal gates underneath. This resolves the conventional issue of unable to integrate the fabrication of metal gates and contact plugs due to optical constraint.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate;
   a plurality of gate structures on the substrate;
   an interlayer dielectric (ILD) layer around the gate structures;
   a first etch stop layer on the ILD layer and the gate structures;
   a first dielectric layer on the first etch stop layer;
   a second etch stop layer on the first dielectric layer;
   a second dielectric layer on the second etch stop layer;
   a plurality of first contact plugs in the ILD layer, the first etch stop layer, and the first dielectric layer for electrically connecting to a source/drain region in the substrate;
   a plurality of second contact plugs in the second etch stop layer and the second dielectric layer for electrically connecting to the first contact plugs, wherein the top surfaces of the second contact plugs and the second dielectric layer are coplanar and a bottom surface of the second contact plugs is greater than a top surface of the first contact plugs; and
   a plurality of third contact plugs in the first etch stop layer, the first dielectric layer, the second etch stop layer, and the second dielectric layer for electrically connecting to the gate structures, wherein the third contact plugs contact the gate structures and the first contact plugs directly.

2. The semiconductor device of claim 1, wherein the gate structures comprise metal gates.

3. The semiconductor device of claim 1, wherein the first etch stop layer and the second etch stop layer comprise silicon nitride.

4. The semiconductor device of claim 1, wherein the first dielectric layer and the second dielectric layer comprise silicon oxide.

5. The semiconductor device of claim 1, wherein the second dielectric layer contacts the second etch stop layer directly.

6. The semiconductor device of claim 1, wherein a top surface of the third contact plugs is equal to a bottom surface of the third contact plugs.

* * * * *